US009329843B2

United States Patent
Cheng et al.

(10) Patent No.: US 9,329,843 B2
(45) Date of Patent: May 3, 2016

(54) COMMUNICATION STACK FOR SOFTWARE-HARDWARE CO-EXECUTION ON HETEROGENEOUS COMPUTING SYSTEMS WITH PROCESSORS AND RECONFIGURABLE LOGIC (FPGAS)

(71) Applicant: International Business Machines Corporation, Armonk, NY (US)

(72) Inventors: Perry S. Cheng, Cambridge, MA (US); Rodric Rabbah, Yonkers, NY (US); Sunil K. Shukla, Tarrytown, NY (US)

(73) Assignee: International Business Machines Corporation, Armonk, NY (US)

( * ) Notice: Subject to any disclaimer, the term of this patent is extended or adjusted under 35 U.S.C. 154(b) by 368 days.

(21) Appl. No.: 13/913,803

(22) Filed: Jun. 10, 2013

(65) Prior Publication Data

US 2014/0208299 A1 Jul. 24, 2014

Related U.S. Application Data

(60) Provisional application No. 61/756,146, filed on Jan. 24, 2013.

(51) Int. Cl.
*G06F 9/45* (2006.01)
*G06F 17/50* (2006.01)

(52) U.S. Cl.
CPC .............. *G06F 8/41* (2013.01); *G06F 17/5045* (2013.01)

(58) Field of Classification Search
CPC .................................................... G06F 17/5054
See application file for complete search history.

(56) References Cited

U.S. PATENT DOCUMENTS

| | | | | |
|---|---|---|---|---|
| 6,553,446 B1* | 4/2003 | Miller | | 710/307 |
| 6,832,181 B1* | 12/2004 | Bolding et al. | | 703/13 |
| 6,944,173 B1* | 9/2005 | Jones et al. | | 370/413 |
| 8,776,190 B1* | 7/2014 | Cavage et al. | | 726/5 |
| 2005/0091441 A1* | 4/2005 | Qi et al. | | 711/5 |
| 2005/0251707 A1* | 11/2005 | Alexander et al. | | 714/49 |
| 2008/0043734 A1* | 2/2008 | Kinoshita et al. | | 370/390 |

(Continued)

OTHER PUBLICATIONS

"Intel Introduces Configurable Intel Atom-based Processor", Nov. 2010, Intel.com, accessed Jun. 10, 2013, pp. 1-5.

(Continued)

*Primary Examiner* — Chat Do
*Assistant Examiner* — Sergio J Curbelo, III
(74) *Attorney, Agent, or Firm* — Scully, Scott, Murphy & Presser, P.C.; Nidhi G. Kissoon

(57) ABSTRACT

A communication stack for software-hardware co-execution on heterogeneous computing systems with processors and reconfigurable logic, in one aspect, may comprise a crossbar operable to connect hardware user code and functioning as a platform independent communication layer. A physical interface interfaces to the reconfigurable logic. A physical interface bridge is connected to the cross and the physical interface. The physical interface bridge connects the crossbar and the physical interface via a platform specific translation layer specific to the reconfigurable logic. The crossbar, the physical interface, and the physical interface bridge may be instantiated in response to the hardware user code being generated, the crossbar instantiated with associated parameters comprising one or more routes and associated data widths. The hardware user code is assigned a unique virtual route in the crossbar.

5 Claims, 4 Drawing Sheets

(56) References Cited

U.S. PATENT DOCUMENTS

2011/0145934 A1* 6/2011 Abramovici et al. ........... 726/30
2014/0007230 A1* 1/2014 Jani et al. ........................ 726/22

OTHER PUBLICATIONS

Zynq-7000: All Programable SoC: Technical Reference Manual, UG585 (v 1.5) Mar. 2013, pp. 1-1770, Xilinx, Inc.
Auerbach et al., "A Complier and Runtime for Heterogeneous Computing," DAC, Jun. 2012, pp. 271-276, AMC, New York, NY.
Auerbach et al., "Lime: a Java-Compatible and Synthesizable Language for Hetergeneous Architectures," OOPSLA/ SPLASH, Oct. 2010, pp. 89-108, AMC, New York, NY.
Auerbach et al., "LIME: The Liquid Metal Programming Language Reference Manual," IBM Research, May 2010, pp. 1-141.
Dubach et al., "Compiling a High-Level Language for GPUs: (via Language Support for Architectures and Compliers)", PLDI Jun. 2012, pp. 1-12, AMC, New York, NY.
Eguro, "SIRC: An Extendable Reconfigurable Computing Communication API," FCCM, May 2010, pp. 135-138.
Khronos OpenCL Working Group, "The OpenCL Specification," Jun. 2011, pp. 1-385.
Kulp, "OpenCPI Technical Summary," May 2010, pp. 1-15.
Nalltech, "PCIe-280-8-lane PCI Express 2.0 Accelerator card featuring Xilinx Virtex-5 FPGA and Memory," Mar. 2011, p. 1.
Saldana et al., "MPI as an Abstraction for Software-Hardware Interaction for HPRCs," HPRCTA, Nov. 2008, pp. 1-10, IEEE.

* cited by examiner

COMMUNICATION STACK FOR SOFTWARE-HARDWARE CO-EXECUTION ON HETEROGENEOUS COMPUTING SYSTEMS WITH PROCESSORS AND RECONFIGURABLE LOGIC (FPGAS)

CROSS-REFERENCE TO RELATED APPLICATIONS

This application claims the benefit of U.S. Provisional Application No. 61/756,146, filed on Jan. 24, 2013, which is incorporated herein by reference in its entirety. This application is related to co-owned U.S. patent application Ser. No. 13/196,300, filed on Aug. 2, 2011, and entitled TECHNIQUE FOR COMPILING AND RUNNING HIGH-LEVEL PROGRAMS ON HETEROGENEOUS COMPUTERS, which application is incorporated herein by reference in its entirety.

FIELD

The present application relates generally to computers, and more particularly to software-hardware bridging in heterogeneous computing systems.

BACKGROUND

While there are numerous field programmable gate array (FPGA)-based system offerings on the market today, there is no single accepted programming standard that facilitates using them. FPGAs are predominantly programmed with hardware description languages (HDLs) and conventional processors are programmed with modern high-level languages. In addition, the compilation and design flow for each of these targets are completely different. Programming FPGAs (hardware) requires the use of electronic design automation (EDA) toolflows that are complex and time consuming to synthesize the HDL into a circuit, whereas programming CPUs (software) enjoys the benefits of well established instruction set architectures (ISAs) and advanced compilers that offer a much simpler programming experience. The lack of (1) a single semantic programming domain, (2) standard FPGA device interfaces, and (3) an integrated toolflow for programming across the hardware-software boundary means the burden is largely on the programmer to manage the heterogeneous complexity.

A number of companies and products are focused on lowering the programming burden associated with FPGAs, but do not address the CPU/FPGA divide directly. Instead, their aim is to raise the programming abstractions offered by HDLs like VHDL and Verilog from the level of gates, muxes and flip-flops to be on par with modern high-level programming languages such as C/C++ and Java. In doing so, they offer the possibility for skilled software developers to design hardware through high-level synthesis: the compilation and synthesis of logic from high-level languages.

Despite many advances in high-level synthesis, programming FPGAs remains difficult, in part because the final integration of software and hardware is a challenge that the programmer bares. A typical off-the-shelf FPGA device is offered as a raw fabric with little or no infrastructural intellectual property (IP) (also referred to as service layer in this disclosure) to connect it to another device or component in a heterogeneous system. The term "IP" in hardware technology (and henceforth in this disclosure) is used to refer to a hardware design block with a well-defined interface and functionality.

There are several vendors that create custom FPGA boards with a highly tuned I/O infrastructure to support communication interfaces such as PCIe, and Ethernet and off-chip memory resources such as DDR-SDRAM, QDR-SRAM etc. The users can implement their applications either in HDL or using a high level synthesis framework and connect it with the infrastructure provided by the board vendor. This leads to a faster time-to-market as users can focus on developing their core application and the communication and storage infrastructure is provided by the board vendor. However, this prevents portability as the vendor infrastructure is often proprietary and created particularly for one board.

BRIEF SUMMARY

A system providing a communication stack for software-hardware co-execution on heterogeneous computing systems with processors and reconfigurable logic, in one aspect, may comprise a crossbar operable to connect hardware user code and functioning as a platform independent communication layer. A physical interface interfaces to the reconfigurable logic. A physical interface bridge may be connected to the crossbar and the physical interface, the physical interface bridge connecting the crossbar and the physical interface via a platform specific translation layer specific to the reconfigurable logic. The crossbar, the physical interface, and the physical interface bridge may be instantiated in response to the hardware user code being generated, the crossbar instantiated with associated parameters comprising one or more routes and associated data widths, the hardware user code being assigned a unique virtual route in the crossbar.

A method for a communication stack for software-hardware co-execution on heterogeneous computing systems with processors and reconfigurable logic, in one aspect, may comprise generating a hardware user code corresponding to a task to be relocated to the reconfigurable logic. The method may also comprise instantiating a crossbar operable to function as a platform independent communication layer, the crossbar instantiated with associated parameters comprising one or more routes and associated data widths. The method may also comprise connecting the hardware user code to the crossbar and assigning a unique virtual route in the crossbar to the hardware user code, wherein communication to the hardware user code is performed via the unique virtual route. The method may further comprise instantiating a physical interface interfacing to the reconfigurable logic. The method may further comprise instantiating a physical interface bridge to connect to the crossbar and the physical interface, the physical interface bridge connecting the crossbar and the physical interface via a platform specific translation layer specific to the reconfigurable logic.

A computer readable storage medium storing a program of instructions executable by a machine to perform one or more methods described herein also may be provided.

Further features as well as the structure and operation of various embodiments are described in detail below with reference to the accompanying drawings. In the drawings, like reference numbers indicate identical or functionally similar elements.

DETAILED DESCRIPTION

Example heterogeneous systems include FPGA-based systems that integrate reconfigurable architectures with conventional processors. However, the burden of managing the coding complexity that is intrinsic to these systems falls entirely on the programmer. This limits the proliferation of these systems as only highly-skilled programmers and FPGA developers can unlock their potential. The present disclosure in one embodiment addresses the programming complexity attributed to heterogeneous FPGA-based systems. A feature of a methodology of the present disclosure in one embodiment may include vertically integrated development lifecycle that appeals to skilled software developers. A canonical IP bridge spanning software and hardware may be provided that is designed to offer a uniform communication methodology between software and hardware, and that is applicable across a wide range of platforms available off-the-shelf.

Field programmable gate arrays (FPGAs) may be used in place of application specific integrated circuits (ASICs) and application specific standard products (ASSPs) for implementing fixed function logic. FPGAs offer the increasing device density and performance as well as high design flexibility and lower small volume costs. There are various kinds of FPGA-based systems ranging from heterogeneous systems targeted at high-performance computing (HPC) that tightly couple FPGAs with conventional central processing units (CPUs) (e.g., Convey Computers), to mid-range commercial-off-the-shelf workstations that use peripheral component inter connect express (PCIe)-attached FPGAs, to low-end embedded systems that integrate embedded processors directly into the FPGA fabric or on the same chip.

A design and implementation of an IP bridge (communication stack) spanning software and hardware in the present disclosure may address the conventional processor(s)/configurable processor(s) (e.g., CPU/FPGA) divide directly. In one aspect, the IP bridge of the present disclosure may permit the integration of new FPGA-based devices into a platform. In addition, an integrated toolchain (a set of programming or development tools for a computing product) may be provided that may significantly lower the engineering burden on programmers and frees them from using complex EDA toolflows directly.

Figure 1:
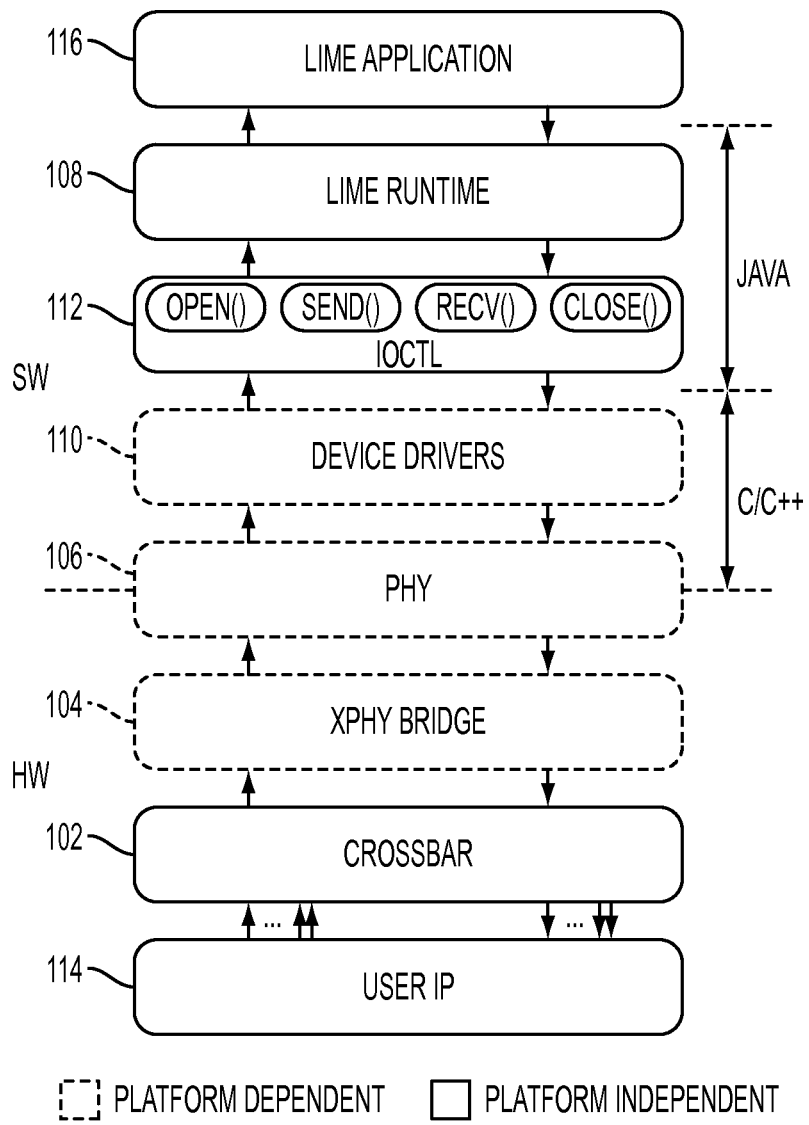
FIG. 1 illustrates an IP bridge spanning hardware and software in one embodiment of the present disclosure.

FIG. 1 illustrates an IP bridge spanning hardware and software. A hardware service layer may be presented that provides I/O capabilities so that the user code may exchange data with the host. Thus, the service layer allows communication between a host machine (e.g., JVM) application and a native device (e.g., FPGA). In one embodiment of the present disclosure, the FPGA service layer includes the following three IP components.

Crossbar (102). All user application code (either generated using compiler or manually written in HDL) is connected to a crossbar 102 which serves as a platform independent communication layer.

XPHY Bridge (104). The crossbar 102 connects to the PHY 106 through a platform specific translation layer.

PHY (106). The PHY IP is usually provided by a third party (e.g., platform vendor). It implements a protocol specific to the communication medium (e.g., PCIe).

The analogous components in software may be implemented in a compiler runtime 108 to interface to the FPGA device driver 110. An example of such compiler may be a Lime compiler. Lime compiler will be reviewed in more detail below as an example programming language that may implement a software part of the IP bridge in one embodiment of the present disclosure.

The crossbar may be embedded in the compiler runtime and match the implementation of the crossbar IP (e.g., 102) in hardware. For instance, the crossbar is embedded in the Lime runtime 108 and matches the implementation of the crossbar IP 102 in hardware. The XPHY bridge represents the interaction between the compiler runtime 108 and the device driver 110. This may be achieved via a thin interface called IOCTL 112, an abbreviation of I/O control.

In FIG. 1, crossbar 102, user IP 114, IOCTL 112, compiler runtime 108 and application program 116 are platform independent. Device drivers 110, PHY 106 and XPHY bridge 104 are platform dependent. Data may be communicated from the software IOCTL layer 112 to the device drivers 110, which for example may move the data via direct memory access (DMA) to the FPGA. The data may be routed through the hardware PHY 106 and crossbar 102 to a loopback circuit (e.g., which sends data back to the software IOCTL layer 112.

IOCTL and Device Driver

The IOCTL interface 112 presents a canonical set of procedures to the compiler runtime that is irrespective of the physical layer between host and device. The host is assumed to be a conventional cache-coherent multicore.

The interface 112 may include the following four procedures: open, close, send, and recv. In one aspect, the interface 112 facilitates the rapid integration of FPGA devices which typically offer few standard programming interfaces if at all. The IOCTL interface 112 is designed to support streaming as well as batch-style communication that is either synchronous or asynchronous in nature.

Table 1 illustrates examples of several instances of the IOCTL interface implemented for a number of different platforms.

TABLE 1

IOCTL examples.

| Device | PHY | FPGA |
| --- | --- | --- |
| Nallatech PCIe280 | PCIe x8 | Virtex5 LX330T |
| PLDA XpressGX4LP | PCIe x8 | Stratix IV GX530 |
| XUPV5 | UART | Virtex 5 LX110T |
| Xilinx ML505 | UART | Virtex 5 LX50T |
| Avnet LX9 | UART | Spartan 6 LX9 |
| HDL Simulators | TCP/IP | — |

In each case, the porting required to support the device was limited to the platform dependent components of the service layer. The model has proved sufficiently flexible to support both high bandwidth PCIe devices with Xilinx and Altera FPGA platforms, and low-bandwidth devices attached over UART. The same model may be used to support co-execution of Lime tasks between the host architecture and HDL simulators that include the Cadence Incisive Enterprise Simulator, Mentor Graphics Modelsim, and the open source Icarus Verilog simulator. Both synchronous and asynchronous execution may be supported.

The UART-attached devices may be enabled via reading and writing over UART, which amount to transactions over a memory-mapped file descriptor. The IOCTL interface may be implemented as follows in one embodiment of the present disclosure.

long handle=open(char*bitfile, int deviceId)
void close(long handle)
int count=send(long handle, byte[ ] sendBuffer, int offset, int length, int timeout)
int count=recv(long handle, byte[ ] recvBuffer, int offset, int length, int timeout)

"open" is responsible for preparing a specified device for I/O. This includes loading the bitfile onto the FPGA and reserving any required resources. The procedure returns a system-specific handle which is used for all subsequent communication with that device. If a task is relocated to an HDL simulator, open launches the desired simulator and configures it with the HDL to simulate. In this case, the bitfile corresponds to an archive containing all the relevant sources, including a Lime-specific (compiler-specific) test bench that serves as the device driver and manages the I/O.

"close" releases the resources associated with the device. This includes shutdown of the simulation process if closing an HDL simulator instead of a physical FPGA device.

"send" attempts to transfer the contents of the given byte buffer (sendBuffer), starting at the specified byte offset, to the device. The amount of data (in bytes) to transmit is given by length. In one embodiment of the present disclosure, the call is blocking and will not return until either all the bytes are sent or the request times out. A timeout is permitted if the time since the call has equaled or exceeded the given timeout threshold. A value of zero for the timeout indicates that timing out is not allowed and the procedure blocks until the transaction completes. The procedure sets the count to the number of bytes actually transmitted upon return.

"recv" requests that up to length number of bytes be read from the FPGA and written into the given byte buffer (recvBuffer) starting at the specified byte offset. In one embodiment of the present disclosure, the call is blocking and will not return until the requested number of bytes is received or the request times out. As is the case with send, a timeout is permitted if the time since the call has equaled or exceeded the specified threshold; timeout is not permitted if the value of timeout is zero. The procedure sets the count to the number of bytes actually received upon return.

A thread-safe implementation of this interface may be provided so that calls to send and receive can occur on different threads, in full duplex mode. In one embodiment of the present disclosure, each send (receive) is atomic in nature, and hence two or more sends (receives) may not interleave. If two concurrent calls to send are made, the implementation finishes the first send request before handling the second.

The Lime runtime supports both synchronous and asynchronous communication models. Synchronous communication follows the batch execution model where the runtime manages the I/O synchronization. On the other hand, asynchronous communication model completely decouples the I/O and is more akin to a streaming I/O model. The runtime spawns send and receive threads and uses a device-appropriate timeout parameter as a flow-control mechanism.

Bridging the PHY and User IP

The PHY (FIG. 1 at 106) is responsible for transferring data across the software-hardware boundary. Generally, the logic associated with the PHY 106 is provided by the FPGA vendor or third party IP vendors who have the liberty to define their own protocols within the FPGA. Regardless of the physical interface, there is a single standard hardware interface to which the compiler generated HDL code is connected. This is because designing, developing and debugging such interfaces in hardware is a far more challenging endeavor compared to software development where symbolic debuggers and high-level tools make analogous work relatively easier.

Figure 2:
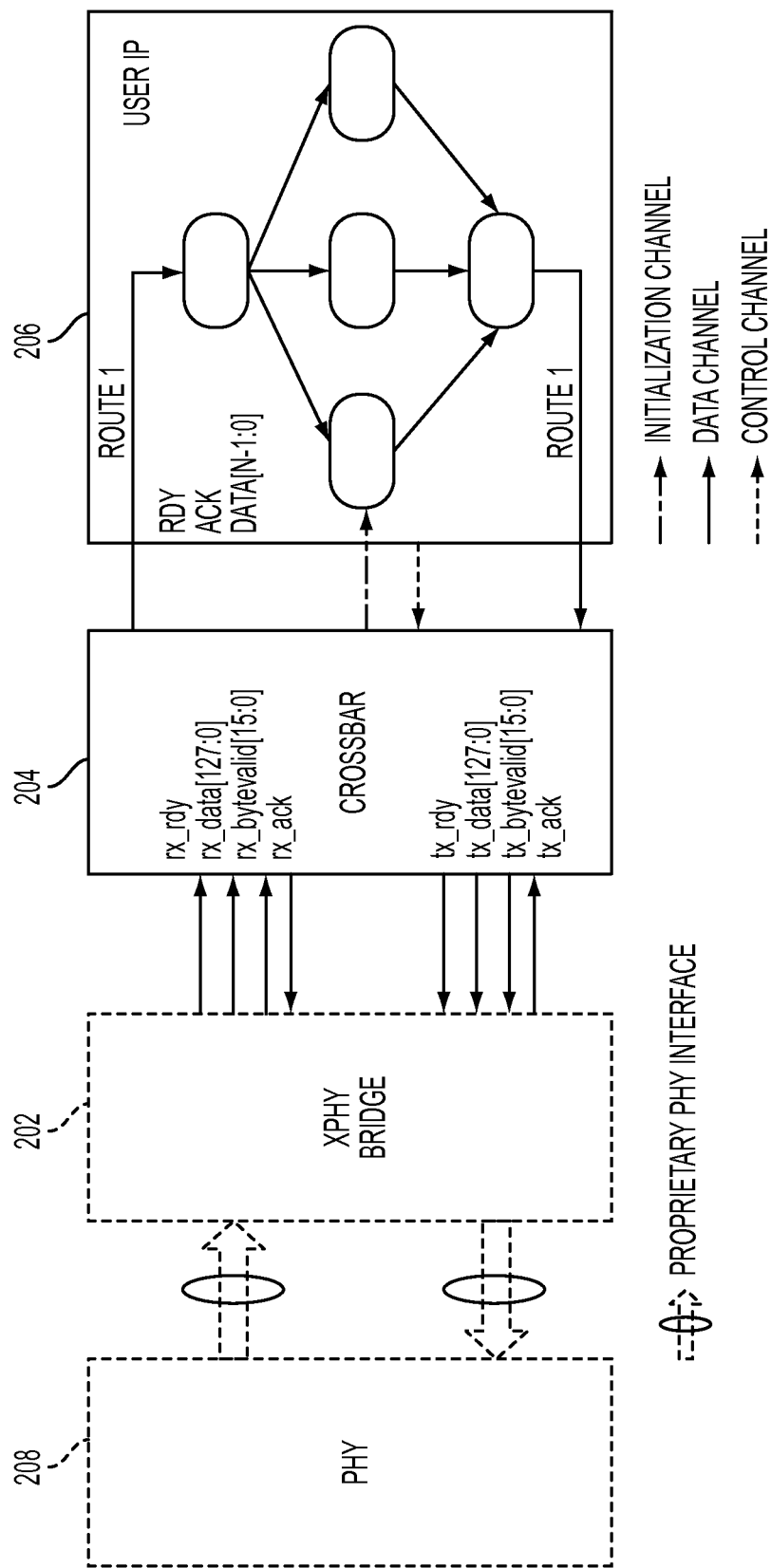
FIG. 2 illustrates the top level design, PHY to user IP bridge in hardware, that is synthesized for a given device in one embodiment of the present disclosure.

The Lime compiler assumes the presence of a canonical component called the crossbar, and generates a top level design that connects all user IP to it. In turn, the top level design with additional IP corresponding to the PHY that is specific to the board may be extended, e.g., when the EDA synthesis tool is invoked to generate a bitfile. The XPHY bridge IP 104 may be extended as well. The latter is a device-specific IP that is developed for each of the platforms shown in Table I. FIG. 2 illustrates the top level design, PHY to user IP bridge in hardware, that is synthesized for a given device.

XPHY Bridge

The XPHY bridge (FIG. 2 at 202) translates the user-side PHY interface to match the crossbar interface. The layers below the XPHY bridge assume a little-endian data format. Any endianness conversion, if required, is handled in the XPHY bridge.

Crossbar

The crossbar (FIG. 2 at 204) is a platform-independent layer that isolates the user IP 206 from the low-level platform-specific details. It also provides the abstraction of multiple virtual routes over which different types of payload (data, messaging, initialization, control) can be transferred between host and the user IP.

The crossbar 204 includes independent receive (rx) and transmit (tx) modules. The receive module disassembles an incoming packet from the PHY 208 and forwards the payload on one or more routes to the user IP 206. The transmit module receives data from one or more routes, encapsulates it into packets and forwards it to the PHY 208. The crossbar 204, for example, can connect to up to 32 incoming and outgoing routes in the egress side. The width of each route can be configured independently by the compiler.

The crossbar 204 uses a ready-acknowledge (rdy-ack) protocol to interface with PHY and the user application logic. The rdy signal is asserted whenever the source has valid data on the data bus. Assertion of the ack signal indicates readiness of the sink to accept data. A valid data transfer is marked by the assertion of rdy and ack in the same clock cycle. The sink can preemptively assert ack even when the source has no valid data (rdy is not asserted). The bytevalid signal indicates the number of valid bytes in the current transfer.

Development LifeCycle

A toolchain (e.g., an integrated development environment (IDE) that may include a compiler such as Lime and integrated synthesis toolflow) may be provided that integrates the EDA design flow into the compilation step so that the end-result of compiling an FPGA-relocated task is a bitfile. A programmer may specify the intended target either via the command line interface or the IDE. This target guides the compiler to instantiate a platform specific top level design that includes the PHY IP, XPHY bridge, crossbar and the generated user IPs.

An example command line invocation of such a toolchain to compile the HelloWorld code for the Nallatech PCIe280 device may include:

% limec–fpga=nallatech.pcie280 HelloWorld.lime

The process is as follows. First, the compiler generates all of the user IP corresponding to the relocated tasks, as well as the Java bytecodes for the remaining parts of the Lime program. Next, it instantiates the crossbar IP using the desired parameters (e.g., routes and data width) and connects the user IP to it. Each relocated task is assigned a unique virtual route when it is connected to the crossbar, thereby allowing other tasks to communicate with it using the route id by sending messages intended for specific routes. Subsequently, a platform specific EDA builder is used to perform the logic synthesis. The target specified on the command line (or through the IDE) informs the builder of the various characteristics of the FPGA platform, including the details of the FPGA part and timing constraints that are to be observed in the top level design.

Hence, in addition to the platform specific IP that includes the IOCTL and XPHY bridge, the present disclosure may provide a platform manifest that encodes the details of the device to aid the compiler in automatically generating bitfiles for the FPGA-targeted Lime code. These three components allow for fully integrating new FPGA devices into the toolchain, lowering the engineering burden attributed to FPGA-based heterogeneous computing. The compiled HelloWorld program may be run on the targeted device using the command line:

% lime–fpga=nallatech.pcie280 HelloWorld, which launches the Java virtual machine (for the host code) and the Lime runtime to manage the native devices and communication across the software-hardware boundary as described herein.

Lime Language Review

Lime is a new programming language designed for heterogeneous computing. It is a Java-compatible language that offers many of the features commonly found in high-level and object-oriented languages. It also includes a number of new features that facilitate the compilation and synthesis for FPGAs among other architectures. The example that follows illustrates some of the core language constructs that implement software-hardware bridging capabilities disclosed in the present disclosure. Those language constructs include task, connect, and relocate.

TABLE 2

Lime example

```
public class Hello World {
public static void main(String[ ] args) {
char[ ] msg = { 'H','E','L','L','O',',',' ',
'W','O','R','L','D','!','\n' };
for (char c : msg) {
char lowered = toLowerCase(c);
System.out.print(lowered);
}
}
static local char toLowerCase(char c) {
return ('A' <= c && c <= 'Z') ?
(char) (c + 'a' – 'A') : c;
}
14 }
```

The example Lime program shown in Table 2 converts an array of characters to lowercase and prints the result to standard output. The variable msg is initialized to contain a sequence of letters (lines 3-4), and the loop (line 5) applies toLowerCase to every character (line 6). The method toLowerCase (lines 10-13) receives a character and returns its lowercased version. Finally, the results are printed to standard output using a Java system utility System.out.print (line 7).

This program has three parts. First is the generation of the character sequence, here achieved using a conventional imperative loop. Second is the actual computation, namely lowercasing each of the characters. Third is the printing of the results to the screen. This pattern is generally representative of applications that exhibit producer-consumer parallelism, also known as pipeline parallelism.

TABLE 3

Lime task graph example

```
2 public static void main(String[ ] args) {
3       char[[ ]] msg = { 'H','E','L','L','O',',',' ',
4               'W','O','R','L','D','!','\n' };
5       var hello = msg.source( )
6           => ([ task toLowerCase ])
7           => task System.out.print(char);
8       hello.finish( ); // execute and await completion
9 }
```

Lime facilitates the expression of pipeline parallelism using the task and connect (=>) operators. Hence the code may be rewritten as shown in Table 3 where the loop is replaced with an explicit task graph that exposes the computation and communication making up the pipeline. The task operator creates a task from an otherwise imperative method as shown on lines 6 and 7 of Table 3. The first task (line 5) is an example of a source. In Lime, arrays are first class types and the source( )method creates a task that emits the contents of the array in sequence, one character at a time. The task on line 6 is called a filter. It repeatedly applies toLowerCase (Table 2) to every character produced by the source. The connect operator (=>) connects the output of one task so it becomes the input to another. This is equivalent to the dataflow one can infer from the loop in Table 2. The final task in the example is a sink. It consumes the results of the previous task but produces no output itself. It is worthy to note that the task operator is applied to methods that may be used in an imperative context (e.g., System.out.print). This is generally true for sources and sinks. However, filters require that the task method is local, meaning that it may not access globally mutable state. A local method is identified with the local keyword as shown on line 10 of Table 2. It is an easily checkable property and when composed with other language features, it provides a guarantee that filters have strong isolation properties. Namely, a local method that is also static and whose arguments are all value types is a pure function. A primitive type (e.g., char) is a value type, as are classes which are modified with the value keyword. A value type is a recursively immutable and acyclic type: once the value is created, it does not mutate. Lime provides arrays that are value types, and these are represented with double brackets as shown on line 3 of Table 3.

Lime leverages task graphs to partition the computation in a heterogeneous system, and maps tasks to the architectures that are best suited for them. A natural mapping of the tasks in Table 3 for an architecture that includes a CPU and an FPGA is one that relocates the filter toLowerCase from the host to the FPGA, and assigns the remaining source and sink tasks to the host CPU. In practice, the compiler or runtime must be cognizant of the characteristics of the task graph and the communication costs to transfer data between the CPU and the FPGA.

The Lime compiler currently relies on the programmer to express their desired mapping from tasks to architectures. By default, all tasks execute on the host. However, the programmer can relocate a task to another target architecture (e.g., FPGA) by surrounding it with "([" and "])" as shown on line 6 of Table 3. The brackets instruct the compiler to statically elaborate the encompassed task graph, and to generate code for the desired target architecture which is specified either on the command line or through a Lime Development Tool, an Eclipse-based IDE (integrated development environment).

Lime programs are compiled to Java bytecode by default and hence the tasks that are mapped to the host will execute in a Java virtual machine (JVM). The relocated tasks will run on their corresponding native device (e.g., FPGA). A service layer that spans software and hardware presented in the present disclosure allows the Lime runtime automatically manage the communication between the JVM and the native device.

Figure 3:
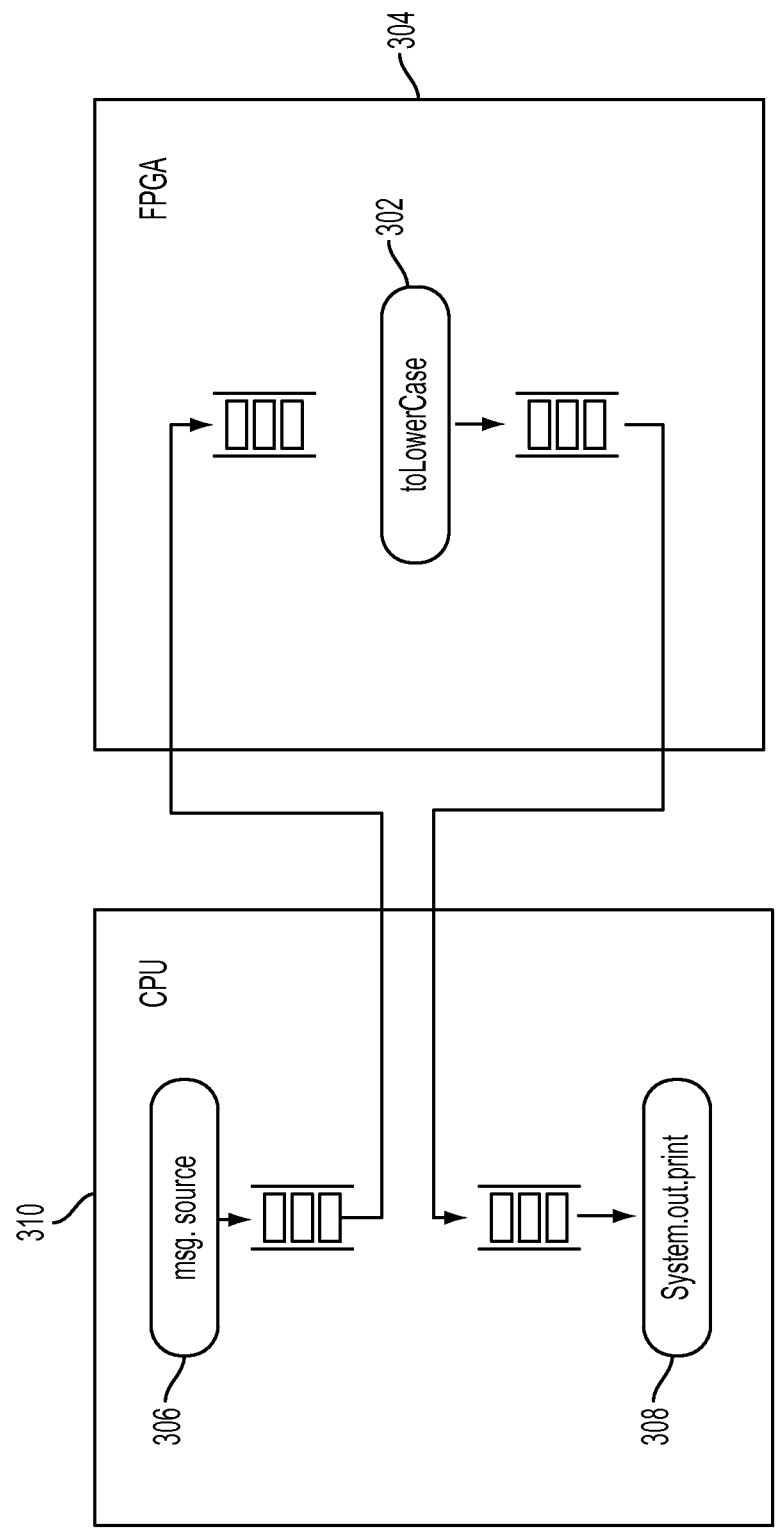
FIG. 3 shows an example mapping of tasks in a CPU and a FPGA in one embodiment of the present disclosure.

The Lime compiler and runtime are designed to (1) significantly improve the programmer experience when targeting heterogeneous systems that include FPGAs, and (2) rapidly support new FPGA computing platforms as they become available. One of the ways this is achieved is through complete vertical integration of the required IP building blocks, EDA logic synthesis tools, and device drivers with a toolchain. The Lime compiler generates Verilog (hardware description language) for tasks that are relocated to the FPGA. The Verilog is a behavioral description of the corresponding user code, and as such, it is called the user IP. The generated IP may not be useful as a standalone component if the end goal is to co-execute tasks across architectures. The host tasks should communicate data to the relocated task, and similarly, the relocated task should communicate data back to the host. In Lime, this communication is represented by the connect operators that describe the flow of data between tasks. Tasks that execute on the host may communicate directly through shared-memory. In contrast, tasks that execute in an FPGA typically lack direct access to the host memory, and data is transported to the device over a physical layer (PHY) by the device driver. FIG. 3 shows the mapping of tasks that corresponds to the HelloWorld example from Table 3. "toLowerCase" task 302 executed on the FPGA 304, while "msg.source" 306 and "system.out.print" 308 are executed in the CPU 310. The divide between the CPU and the FPGA represents the PHY which is bridged to enable computing on such heterogeneous systems. Hence the compiler may generate the user IP, and also integrate it with a hardware service layer that provides I/O capabilities so that the user IP may exchange data with the host (e.g., CPU).

Lime language is platform agnostic. The partitioning of Lime code between host and device is not, and tasks may be migrated between the device and host, dynamically and transparently. This is unique and meaningful because it permits the Lime runtime to respond to changes in the application working set dynamically, by migrating tasks to where they may run best. In addition, in multi-user systems where the devices are shared, this ability to migrate task seamlessly throughout the system provides a mechanism for sharing and load balancing. In another aspect, Lime provides language features that are specifically influenced by HDLs. These include the ability to express pipeline parallelism easily, in addition to data and bit level parallelism. Yet in another aspect, a Lime API may support both synchronization protocols and a completely asynchronous streaming model using I/O timeouts. This simplifies the amount of work one has to do to interface the Lime IP bridge to the underlying PHY and device driver.

The above described a canonical interface for bridging software and hardware in heterogeneous FPGA-based systems referred to as an IP bridge. The design of the IP bridge is such that it is applicable across a wide range of FPGA platforms available off-the-shelf. For example, versions of this interface are implemented for PCIe and UART attached FPGAs, as well as HDL simulators. The IP bridge helps to provide a single integrated development framework for heterogeneous systems using a programming language such as the Lime programming language. The Lime compiler is capable of fully driving EDA tools to synthesize bitfiles from high-level Lime code. This lowers the burden of designing applications that co-execute between a conventional host processor and an FPGA. The space overhead of the IP bridge, measured in terms of FPGA resource utilization, is very small. The cost of the abstractions in the Lime runtime is also well amortized for large packet sizes.

An example of data path between software and hardware may be as follows: Data is sent across the Java Native Interface from the main (JVM) program to native C code which implements the software IOCTL layer. The data is communicated from the software IOCTL layer to the device drivers, which move the data via DMA to the FPGA. The data is routed through the hardware PHY and crossbar to a loopback circuit. In each iteration, the data then travels through the same layers in the reverse direction, back to the main program.

Figure 4:
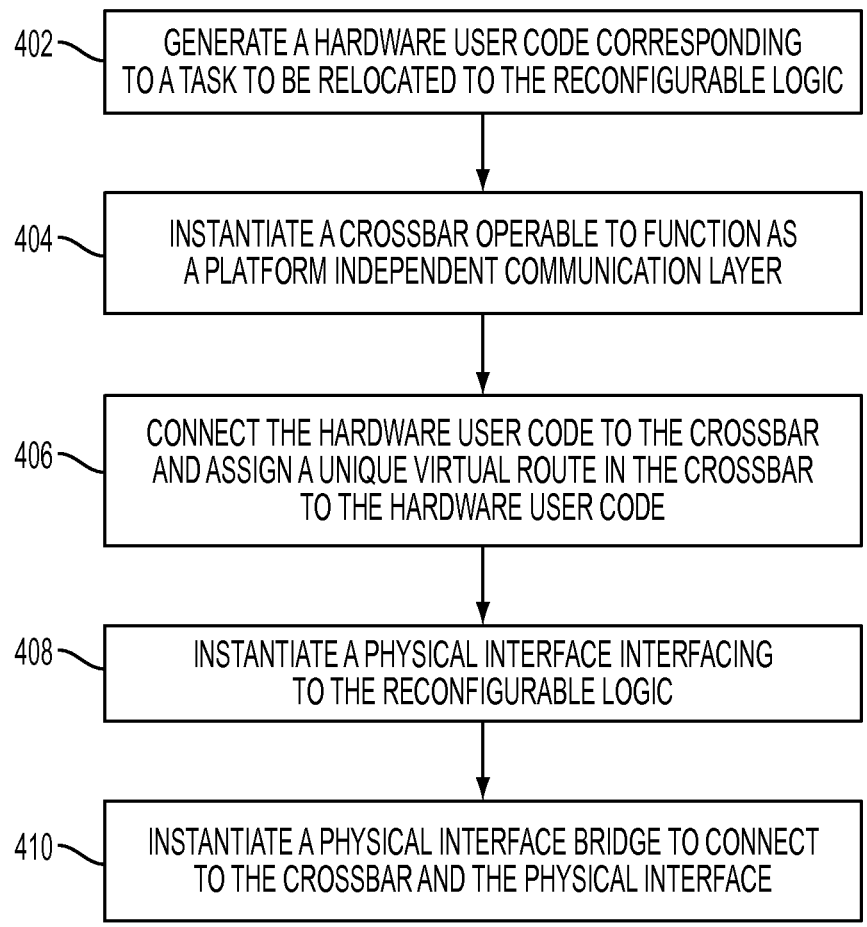
FIG. 4 is a flow diagram illustrating a method in one embodiment of the present disclosure.

FIG. 4 is a flow diagram illustrating a method of the present disclosure in one embodiment for providing a communication stack for software-hardware co-execution on heterogeneous computing systems with processors and reconfigurable logic (e.g., FPGAs). At 402, hardware user code corresponding to a task to be relocated to the reconfigurable logic is generated. For instance, as described above, a compiler such as the Lime compiler may generate a hardware description language corresponding to the task to be relocated in a program being compiled. At 404, a crossbar operable to function as a platform independent communication layer is instantiated. The crossbar may be instantiated with associated parameters comprising one or more routes and associated data widths. At 406, the hardware user code is connected to the crossbar and assigned a unique virtual route in the crossbar. Communication to the hardware user code may be performed via the unique virtual route or using a unique virtual route identifier. At 408, a physical interface (PHY) interfacing to the reconfigurable logic is instantiated. At 410, a physical interface bridge (XPHY bridge) is instantiated which connects the crossbar and the physical interface via a platform specific translation layer specific to the reconfigurable logic.

As described above, a communication stack may be presented for co-execution of a user application on a heterogeneous system having software (processors) and hardware (reconfigurable logic such as FPGA) components. The communication between the SW and HW happens over the physical interface. The HW stack includes a platform independent layer called crossbar to which the hardware part of the user application logic interfaces to. The crossbar provides the abstraction of virtual routes allowing several independent channels of communication between the user application code running in SW and HW. The SW stack includes a light weight I/O control layer, which provides the ability to open and close the HW device; and read and write data chunks between SW and HW part of the user application logic.

As will be appreciated by one skilled in the art, aspects of the present invention may be embodied as a system, method or computer program product. Accordingly, aspects of the present invention may take the form of an entirely hardware embodiment, a software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages, a scripting language such as Perl, VBS or similar languages, and/or functional languages such as Lisp and ML and logic-oriented languages such as Prolog. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The computer program product may comprise all the respective features enabling the implementation of the methodology described herein, and which—when loaded in a computer system—is able to carry out the methods. Computer program, software program, program, or software, in the present context means any expression, in any language, code or notation, of a set of instructions intended to cause a system having an information processing capability to perform a particular function either directly or after either or both of the following: (a) conversion to another language, code or notation; and/or (b) reproduction in a different material form.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Various aspects of the present disclosure may be embodied as a program, software, or computer instructions embodied in a computer or machine usable or readable medium, which causes the computer or machine to perform the steps of the method when executed on the computer, processor, and/or machine. A program storage device readable by a machine, tangibly embodying a program of instructions executable by the machine to perform various functionalities and methods described in the present disclosure is also provided.

The system and method of the present disclosure may be implemented and run on a general-purpose computer or special-purpose computer system. The terms "computer system" and "computer network" as may be used in the present application may include a variety of combinations of fixed and/or portable computer hardware, software, peripherals, and storage devices. The computer system may include a plurality of individual components that are networked or otherwise linked to perform collaboratively, or may include one or more stand-alone components. The hardware and software components of the computer system of the present application may include and may be included within fixed and portable devices such as desktop, laptop, and/or server. A module may be a component of a device, software, program, or system that implements some "functionality", which can be embodied as software, hardware, firmware, electronic circuitry, or etc.

The embodiments described above are illustrative examples and it should not be construed that the present invention is limited to these particular embodiments. Thus, various changes and modifications may be effected by one skilled in the art without departing from the spirit or scope of the invention as defined in the appended claims.

We claim:

1. A method for a communication stack for software-hardware co-execution on heterogeneous computing systems with processors and reconfigurable logic, comprising:
generating a hardware user code corresponding to a task to be relocated to the reconfigurable logic;
instantiating a crossbar operable to function as a platform independent communication layer, the crossbar instantiated with associated parameters comprising one or more routes and associated data widths, the crossbar residing in hardware and operable to isolate the hardware user code from low-level platform-specific details and provide multiple virtual routes over which different types of payload can be transferred between a host processor and the hardware user code running on the reconfigurable logic;
connecting the hardware user code to the crossbar and assigning a unique virtual route in the crossbar to the hardware user code, wherein communication to the hardware user code is performed via the unique virtual route;
communicating data between hardware user code running on one or more of the processors and the hardware user code running on the reconfigurable logic via the assigned unique virtual route using an input-output control interface implementing a set of procedures;
instantiating a physical interface interfacing to the reconfigurable logic;
and instantiating a physical interface bridge to connect to the crossbar and the physical interface, the physical interface bridge comprising a platform specific translation layer connecting the crossbar and the physical interface via a platform specific translation layer specific to the reconfigurable logic.

2. The method of claim 1, wherein the hardware user code is generated by a compiler capable of compiling a program unaware of communication protocols into a design consistent with an API associated with the crossbar.

3. The method of claim 2, wherein the set of procedures supports synchronous and asynchronous communications.

4. The method of claim 2, wherein the input-output control interface is implemented in a compiler enabled to compile a program containing instructions for running on one or more of the processors and instructions to be relocated to the reconfigurable logic.

5. The method of claim 2, wherein the set of procedures comprises:
an open procedure operable to load a bitfile onto the reconfigurable logic and reserve one or more resources of the reconfigurable logic, the open procedure further operable to return a handle used for subsequent communication with the reconfigurable logic;
a close procedure operable to release the one or more resources;
a send procedure operable to transfer contents of a given send buffer starting at a specified send offset, to the reconfigurable logic;
and a receive procedure operable to request that up to a specified length number of bytes be read from the reconfigurable logic and written into a given receive buffer starting at a specified receive offset.

* * * * *